US006188028B1

(12) United States Patent
Haba et al.

(10) Patent No.: US 6,188,028 B1
(45) Date of Patent: Feb. 13, 2001

(54) MULTILAYER STRUCTURE WITH INTERLOCKING PROTRUSIONS

(75) Inventors: Belgacem Haba, Cupertino; Masud Beroz, Milpitas, both of CA (US)

(73) Assignee: Tessera, Inc., San Jose, CA (US)

( * ) Notice: Under 35 U.S.C. 154(b), the term of this patent shall be extended for 0 days.

(21) Appl. No.: 09/094,089

(22) Filed: Jun. 9, 1998

Related U.S. Application Data

(60) Provisional application No. 60/049,021, filed on Jun. 9, 1997.

(51) Int. Cl.[7] .................................................. H01R 9/09
(52) U.S. Cl. .................... 174/266; 174/262; 174/255; 174/267; 439/66; 29/830; 361/785; 361/791
(58) Field of Search ................. 439/66, 70; 361/785, 361/786, 790, 791; 174/260, 261, 266, 264, 255, 267; 267/690, 686; 29/830

(56) References Cited

U.S. PATENT DOCUMENTS

| 3,316,618 | 5/1967 | Guarracini | 228/179.1 |
|---|---|---|---|
| 3,509,270 | 4/1970 | Dube et al. | 174/266 |
| 3,541,222 | 11/1970 | Parks et al. | 174/260 |
| 3,616,532 | 11/1971 | Beck | 29/615 |
| 3,663,931 * | 5/1972 | Brown | 439/75 |
| 3,739,469 | 6/1973 | Dougherty, Jr. | 29/852 |
| 3,795,037 | 3/1974 | Luttmer | 29/883 |
| 3,862,790 | 1/1975 | Davies et al. | 439/66 |
| 4,249,302 | 2/1981 | Crepeau | 29/830 |
| 4,548,451 | 10/1985 | Benarr | 439/85 |
| 4,655,519 | 4/1987 | Evans et al. | 439/74 |
| 4,707,657 * | 11/1987 | Boegh-Petersen | 324/158 F |
| 4,716,049 | 12/1987 | Patraw | 427/96 |
| 4,729,809 | 3/1988 | Dery et al. | 156/306.6 |
| 4,788,766 | 12/1988 | Berger et al. | 29/830 |
| 4,793,814 | 12/1988 | Zifcak | 439/66 |
| 4,902,606 | 2/1990 | Patraw | 430/314 |
| 4,924,353 | 5/1990 | Patraw | 361/783 |
| 4,954,878 | 9/1990 | Fox | 257/675 |
| 5,129,142 | 7/1992 | Bindra et al. | 29/852 |
| 5,167,512 | 12/1992 | Walkup | 439/66 |
| 5,224,265 | 7/1993 | Dux et al. | 29/852 |
| 5,228,861 | 7/1993 | Grabbe | 439/66 |
| 5,229,647 * | 7/1993 | Gnadinger | 257/785 |
| 5,232,548 | 8/1993 | Ehrenberg et al. | 216/18 |
| 5,282,312 | 2/1994 | DiStefano et al. | 29/830 |
| 5,354,205 | 10/1994 | Feigenbaum et al. | 439/67 |
| 5,367,764 | 11/1994 | DiStefano et al. | 29/830 |
| 5,442,143 * | 8/1995 | Schmidt et al. | 174/262 |
| 5,613,033 * | 3/1997 | Swamy et al. | 361/790 |
| 5,758,413 * | 6/1998 | Chong et al. | 29/852 |
| 5,879,787 * | 3/1999 | Petefish | 428/209 |
| 5,936,848 * | 8/1999 | Mehr et al. | 361/777 |
| 5,951,305 | 9/1999 | Haba | 439/70 |

* cited by examiner

*Primary Examiner*—Jeffrey Gaffin
*Assistant Examiner*—Kamand Cuneo
(74) *Attorney, Agent, or Firm*—Lerner, David, Littenberg, Krumholz & Mentlik, LLP

(57) ABSTRACT

A multilayer structure includes a plurality of stacked circuit panels interconnected by posts extending through each panel. Circuit traces provided on one or both surfaces of each circuit panel interconnect the connectors in a predetermined pattern. The connectors are provided with a blind via which is in electrical contact with a pair of contact pads on either surface of the circuit panel. One of the contact pads has an opening to allow access of a connecting post to the interior of the blind via, the other contact pad having a protruding post. The circuit panels are interconnected by inserting the post of one circuit panel into the blind via of an adjacent circuit panel.

81 Claims, 5 Drawing Sheets

MULTILAYER STRUCTURE WITH INTERLOCKING PROTRUSIONS

This application claims the benefit of Provisional Patent Application No. 60/049,021, filed Jun. 9, 1997.

FIELD OF THE INVENTION

The present invention relates to the field of electrical circuitry, for example, the electrical and mechanical interconnection of layers in a multilayer structure, and more particularly, relates to layered circuit structures such as multilayer circuit panels, to components and methods utilized in fabrication of such structures and to methods of making the same.

BACKGROUND OF THE INVENTION

Electrical components are commonly mounted on circuit panel structures such as printed circuit panels. Circuit panels ordinarily include a generally flat sheet of dielectric material with electrical conductors disposed on a major, flat surface of the sheet or on both major surfaces. The conductors are commonly formed from metallic materials such as copper and serve to interconnect the electrical components mounted to the board. Where the conductors are disposed on both major surfaces of the panel, the panel may have via conductors extending through the dielectric layer so as to interconnect the conductors on opposite surfaces.

Multilayer circuit panel assemblies have been made heretofore which incorporate plural, stacked circuit panels with additional layers of dielectric materials separating the conductors on mutually facing surfaces of adjacent panels in the stack. These multilayer assemblies ordinarily incorporate interconnections extending between the conductors on the various circuit panels in the stack as necessary to provide the required electrical interconnections.

Electrical components which can be mounted to circuit panel structures include so-called "discrete", components and integrated circuits which include numerous transistors on a single chip. Chips of this nature can be mounted to elements commonly referred to as "chip carriers" which are specialized circuit panel structures. A chip carrier may be incorporated in a package which is mounted to a larger circuit panel and interconnected with the remaining elements of the circuit. Alternatively, the chip can be mounted directly to the same circuit panel which carries other components of the system. This arrangement is ordinarily referred to as a "hybrid circuit". Relatively large circuit panels are commonly made of polymeric materials, typically with reinforcement such as glass, whereas very small circuit panels such as those used as semiconductor chip carriers may be formed from ceramics, silicon or the like.

There have been increasing needs for circuit panel structures which provide high density, complex interconnections. These needs are addressed by multilayer circuit panel structures. The methods generally used to fabricate multilayer panel structures have certain serious drawbacks. Multilayer panels are commonly made by providing individual, dual sided circuit panels with appropriate conductors thereon. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes are drilled through the stack at locations where electrical connections between different boards are desired. The resulting holes are then coated or filled with electrically conductive materials, typically by plating the interiors of the holes to form what is called a plated through hole. It is difficult to drill holes with a high ratio of depth to diameter. Thus, the holes used in assemblies fabricated according to these prior methods must be relatively large and hence consume substantial amounts of space in the assembly. These holes ordinarily extend from the top or bottom of the stack. Even where interconnections are not required in the top or bottom layers, space must be provided for holes to pass through these layers so as to provide needed interconnections in the middle layers. Accordingly, substantial amounts of the available surface area on the panels must be allocated to the holes and to accommodate tolerance zones around the holes. Moreover, the electrical interconnections formed by depositing conductive materials in such drilled holes tend to be weak. The drilling method and the general nature of the laminates used therein is described, for example in Doherty, Jr., U.S. Pat. No. 3,793,469; and Guarracini, U.S. Pat. No. 3,316,618.

Various alternative approaches have been proposed. Parks, et al., U.S. Pat. No. 3,541,222; Crepeau, U.S. Pat. No. 4,249,302; Luttmer, U.S. Patent No. 3,795,037; Davies, et al., U.S. Pat. No. 3,862,790, Fox, U.S. Pat. No. 4,954,878 and Zifcak, U.S. Pat. No. 4,793,814 all relate generally to structures which have metallic or other conductive elements arranged at relatively closely spaced locations on a dielectric sheet with the conductive elements protruding through the dielectric sheet in both directions. Such a sheet may be sandwiched between a pair of circuit panels and the circuit panels may be clamped or otherwise held together so as to provide mechanical engagement between conductive elements on the adjacent faces of the circuit panels and the conductive elements of the composite sheet. In each of these arrangements, the conductive elements, the composite sheet or both is resilient or malleable so as to provide for close engagement between the conductive elements of the composite sheet and the conductors on the circuit panels.

Beck, U.S. Pat. No. 3,616,532 and Dube, et al., U.S. Pat. No. 3,509,270 describe variants of this approach in which resilient elements are used with a fusible solder. These elements are mounted on insulating boards which are then stacked between printed circuit layers. The assembly is heated so as to melt the solder, thereby freeing the resilient elements so that the resilient elements and solder cooperatively form an interconnection between the adjacent circuit panels.

Evans, et al., U.S. Pat. No. 4,655,519 describes a connector with numerous strip-like contact springs disposed in holes in a flat dielectric body, together with other spring elements. The ends of the strips protrude from opposite surfaces of the body. These are adapted to compress when electronic elements are engaged with the body surfaces, so that the ends of the strips engage pads on the electronic elements. Walkup, U.S. Pat. No. 5,167,512 discloses a further system using springs disposed in holes in a dielectric body.

Grabbe, U.S. Pat. No. 5,228,861 describes a connector having a sheet-like dielectric body with numerous generally X-shaped spring contact elements, each having four arms, lying on a first side of the sheet. Two arms of each X-shaped element are bent inwardly toward the sheet, and extend through holes in the sheet so that the tips of these arms protrude above the second, opposite face of the sheet. The other two arms are bent away from the sheet, and hence protrude from the first surface. When the connector is placed between circuit panels, each X-shaped element is compressed between mating pads of the circuit panels, causing the bent arms to flatten and causing the tips of the arms to wipe the surfaces of the pads. After engagement, the contact is maintained by the resilience of the arms.

Bernarr, et al., U.S. Pat. No. 4,548,451 describes a connector or interposer having a sheet-like elastomeric body with crushable protrusions extending outwardly from oppositely-directed surfaces. Tabs formed from a metal-coated flexible film extend on both surfaces of the body, and overlie the protrusions. The tabs on opposite sides are connected to one another by vias. When the interposer is engaged between circuit panels, the tabs and posts are crushed between contact pads on opposing panels, and the tabs assertedly wipe the pads for more effective contact. The tabs are maintained in engagement with the pads by the resilience of the elastomeric sheet and the posts; there is no permanent bond formed.

Patraw, U.S. Pat. Nos. 4,716,049; 4,902,606; and 4,924,353, describe microelectronic connection schemes using deformable contacts protruding upwardly from a substrate. Each contact has a dome-like tip and a plurality of legs extending downwardly from the tip to the substrate. These contacts are formed by selective deposition of aluminum on pedestals of a fugitive material such as potassium chloride or a photoresist using a shaped mask. The pedestals are removed after deposition.

Dery, et al., U.S. Pat. No. 4,729,809, discloses the use of an anisotropically conductive adhesive material disposed between opposing sublaminates, the adhesive composition having sufficient conductivity across the relatively small spaces between conductors on adjacent layers to form an electrical interconnection therebetween, but having low conductivity across the relatively large spaces between adjacent conductors on the same surface so that it does not produce an unwanted lateral interconnection along one surface.

Berger, et al., U.S. Pat. No. 4,788,766, uses conductor bearing circuit lamina having hollow, eyelet-like via structures, each such via structure having a rim protruding vertically from the surrounding structure. Each such via structure is provided with a thin layer of a conductive bonding material. In making the multilayer structure, dielectric bonding films are interposed between the circuit bearing lamina. The dielectric films have apertures in locations corresponding to the locations of the eyelet structures, in the adjacent circuit bearing lamina. Thus, the upstanding rims of the eyelet structures can bear upon one another when the assembly is forced together under heat and pressure. The layers of conductive bonding material on the rims of the abutting eyelets are said to form bonds between the abutting eyelet structures.

Co-pending U.S. patent application Ser. No. 08/277,366 of Thomas H. DiStefano, et al., which is assigned to the same assignee as the present application, discloses in certain embodiments an interposer having deformable contacts protruding upwardly from its surfaces. Each contact has a central axis normal to the surface and a peripheral portion adapted to expand radially outwardly from the central axis in response to a force applied by a pad on an engaged circuit panel. Thus, when the circuit panels are compressed with the interposers, the contacts expand radially and wipe across the pads. The wiping action facilitates bonding of the contacts to the pads, as by conductive bonding material carried on the contacts themselves.

Other structures for forming multilayer electronic assemblies are taught in Dux, et al., U.S. Pat. No. 5,224,265 and Ehrenberg, et al., U.S. Pat. No. 5,232,548, which use sublaminates made by depositing a dielectric material onto a perforated metal sheet, as by vapor-phase polymerization or electrophoretic bonding, to form a dielectric sheet with vias. The vias are filled with a flowable joining material such as a metal-loaded polymer. These structures are stacked and heated to join the vias into unitary vertical conductors.

Feigenbaum, et al., U.S. Pat. No. 5,354,205 discloses forming connections between layers in a multilayer circuit panel by providing a plated via in one of the layers of the circuit panel, and providing a tapered protrusion having a conical or pyramidal shape aligned with the via on an adjacent layer of the circuit panel. In such a configuration, the circuit panel is not configured to enable connection for multiple stacking of one circuit panel to another. Further, the disclosed configuration relies upon the use of tapered protrusions in the form of male members which wedge into the circumferential opening of the plated vias. This connection which has small surface area contact is not always reliable thereby forming a potential failure point.

Other multilayer assembly systems using flowable conductive materials to join structures in stacked elements are disclosed in Bindra et al., U.S. Pat. No. 5,129,142. Still further improvements are disclosed in certain embodiments in U.S. Pat. Nos. 5,282,312 and 5,367,764 both to Thomas H. DiStefano et al., which are hereby incorporated in their entirety herein. The '312 patent discloses as background certain lamination techniques or methods of making multilayer circuit assemblies using flowable conductive materials.

Despite all of these efforts toward manufacture of multilayer circuit panels having electrical circuits thereon, there have still been needs for further improvements in such circuit panels in the manner of interlocking same in a composite multilayer stack.

SUMMARY OF THE INVENTION

The present invention broadly relates to circuit panels having a plurality of connectors which may be interconnected over their major opposing surfaces by conductive circuit traces. The circuit panels are interconnected into a multilayer stack of circuit panels using the connectors, and optionally, an intermediate adhesive or compliant layer. In accordance with the present invention, the connectors include two contacts provided on either side of the circuit panel which is in the nature of a sheet-like layer or body of dielectric material. A thru hole in the dielectric layer extends between the two contacts. A hole is provided in one of the contacts which is aligned with the hole in the dielectric layer, the other contact being a solid contact. The hole in the dielectric layer, together with the hole in the contact, are plated to form a plated blind via connection at its lower end to the solid contact. The plating of the inner surfaces of the holes extends continuously from the blind end where it connects to the solid contact, to the open end where it forms an upper layer of the contact having a hole.

Extending downward from the solid contact is a post-like bump. The post-like bump may have a bulbous, arrow-shaped, or other configured end portion at its distal end for mating in an adjoining via, or may be uniformly cylindrical or of other uniform cross section.

Adjacent circuit panels and their delineated traces may be interconnected by aligning a contact on one layer with a contact on an adjacent layer, and then applying a force to insert the post-like bump into the plated via through the hole in the contact. Multiple circuit panel layers may be interconnected using stacked connectors according to the present invention. In the embodiment where the post-like bump has an enlarged portion at its distal end, the plated via may be provided with an enlarged portion below the surface of the contact pad, providing a "snap fit" with the post-like bump. Alternatively, a post-like bump having a uniform cross section may be used. In such a configuration, the post-like bump has a diameter slightly larger than the plated via, to provide an interference fit whereby a wiping action occurs during insertion.

In order to form a circuit panel for a multilayer structure according to the present invention, a dielectric sheetlike element or body is first covered on both major surfaces with metallic layers such as a copper layer. The metallic layers may be laminated onto the dielectric layer or may be plated. Openings are then etched through one of the two metallic layers using an acid or other etching solution. Each etched hole extends through the metallic layer to the surface of the dielectric layer. Vias aligned with the openings in the metal layer are then formed in the dielectric layer using a laser, chemical or plasma etching process. The nature of the etching process typically forms vias having a larger diameter at their upper surfaces and a smaller diameter at their blind ends. This is due to the longer exposure time to the etching solution at the top of the hole. The hole in the dielectric layer may be larger than the hole in the metal layer to provide a "snap fit" as described above. Alternatively, a hole substantially corresponding in size to the hole in the metallic layer having a constant cross-sectional area, such as is formed using laser drilling, may be etched or otherwise formed in the dielectric layer.

The vias in the dielectric layer and the metallic layer are next plated with copper, gold or other conductive metal or alloy. The top surface of the upper metal layer is plated together with the entire internal geometry of the via. The blind end of the via is formed by the upper surface of the bottom metallic layer. The plated via at this stage of the process electrically interconnects the upper and lower metallic layers. The metallic layers, together with the plated surface on the upper metallic layer, are etched to form metallic contact pads surrounding the vias on either side of the dielectric layer. In this step, interconnecting circuit traces may also be formed on the dielectric layer for interconnecting various contacts. In a final operation, a post-like bump is formed on the bottom side of the bottom metal layer. As discussed above, the post may or may not have a bulbous distal end for snap fitting in the via. The post-like bump may be formed, for example, by plating a hole in a sacrificial mask layer.

The connector of the present invention provides a low inductance connection between layers in a multilayer structure when connecting circuit panels such as when used as an interposer. The circular vias, by their nature, create relatively low levels of inductance when conducting current. In one embodiment, the blind via may contain conductive material before insertion of the male connector member, i.e., post-like bump. The conductive material may be contained within an enlarged portion of the via formed in the dielectric layer. The conductive material mechanically and electrically bonds the via to the post-like bump.

In another embodiment, the post-like bump may be longer than the vertical clearance provided in the blind via. In that case, the post-like bump is partially crushed during assembly into the via as the bump bottoms on the lower contact. The crushing provides additional wiping action between the two elements, and the crushed post may act as a retainer, preventing the post-like bump from sliding out of the via.

A layer of dielectric adhesive or compliant material may be provided on one or both surfaces of adjoining dielectric layers to seal the regions surrounding the contacts, and to support and mechanically connect the dielectric layers in regions between contacts. The adhesive may be provided as a sheet having holes corresponding to the contacts. The sheet is aligned with the contacts on the dielectric layer, and assembled onto the dielectric layer before adjoining dielectric layers are assembled. Alternatively, the adhesive may be a flowable adhesive printed or stenciled onto the dielectric layer before assembly.

In accordance with one embodiment of the present invention there is described a connector for making electrical connection to an element having a body defining first and second surfaces opposing each other and an opening extending through the body between the first and second surfaces, the connector comprising a first contact on the first surface proximate the opening, a second contact on the second surface overlying the opening, a conductive layer lining the interior of the opening within the body and in contact with the first and second contacts, and a post extending away from the second surface in contact with the second contact.

In accordance with another embodiment of the present invention there is described a circuit panel for making electrical connection to contacts on an adjacent circuit panel, the circuit panel comprising a body defining first and second surfaces opposing each other, an opening extending through the body between the first and second surfaces, a first contact on the first surface surrounding the opening thereat, a second contact on the second surface overlying the opening thereat, a conductive layer lining the interior of the opening within the body in contact with the first and second contacts, the conductive layer defining an opening within the body having a blind end adjacent the second surface in contact with the second contact and an open end extending through the first contact, the conductive layer extending over a portion of the surface of the first contact, and a post extending from the second contact in alignment with the opening formed by the conductive layer.

In accordance with another embodiment of the present invention there is described a method of making a connector for an element having a body defining first and second surfaces opposing each other, the method comprising the steps of forming a first contact on the first surface and a second contact on the second surface in alignment with the first contact, forming an opening through the first contact and the body terminating at the second contact, depositing a conductive layer lining the interior of the opening within the body and in contact with the first and second contacts and forming a post extending away from the second surface in contact with the second contact.

In accordance with another embodiment of the present invention there is described a method of making a circuit panel for making electrical connection to contacts on an adjacent circuit panel, the circuit panel including a body defining first and second surfaces opposing each other, the method comprising the steps of forming an opening extending through the body between the first and second surfaces, forming a first contact on the first surface surrounding the opening thereat and a second contact on the second surface overlying the opening thereat, depositing a conductive layer lining the interior of the opening within the body in contact with the first and second contacts and over a portion of the surface of the first contact, the conductive layer defining an opening within the body having a blind end adjacent the second surface in contact with the second contact and an open end extending through the first contact, and forming a post extending from the second contact in alignment with the opening formed by the conductive layer.

BRIEF DESCRIPTION OF THE DRAWINGS

The above description, as well as further objects, features and advantages of the present invention will be more fully understood with reference to the following detailed description of a multilayer structure with interlocking devices, when taken in conjunction with the accompanying drawings, wherein.

DETAILED DESCRIPTION OF THE PREFERRED EMBODIMENTS

Figure 1:
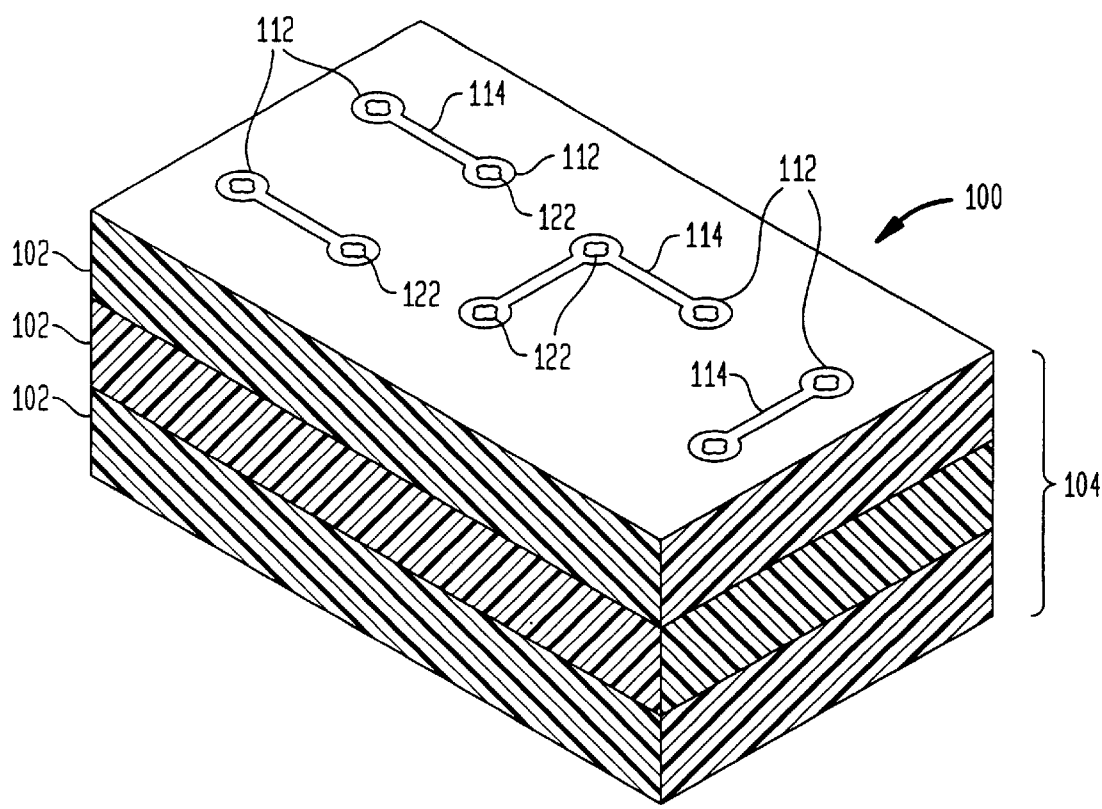
FIG. 1 is a schematic perspective view showing an assembled multilayer structure of interconnected circuit panels constructed and assembled according to the present invention.
Figure 2:
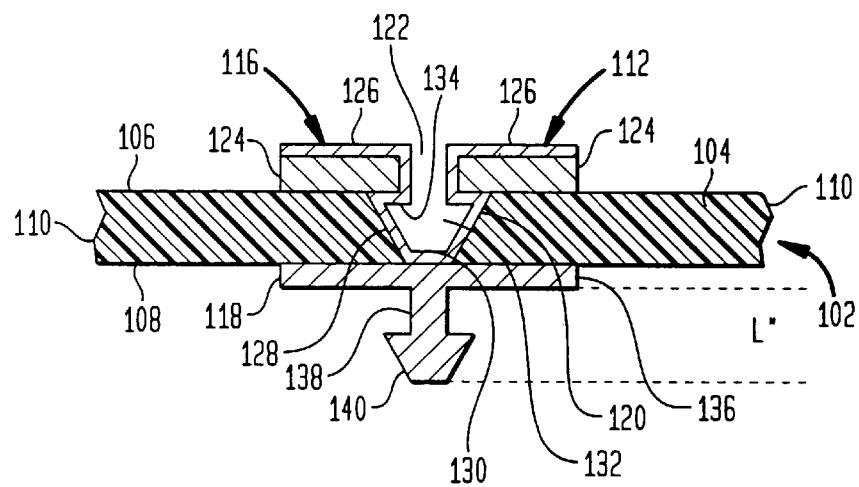
FIG. 2 is a cross-sectional view of a connector in accordance with one embodiment of the present invention for interconnecting a plurality of circuit panels in a multilayer stack.
Figure 3:
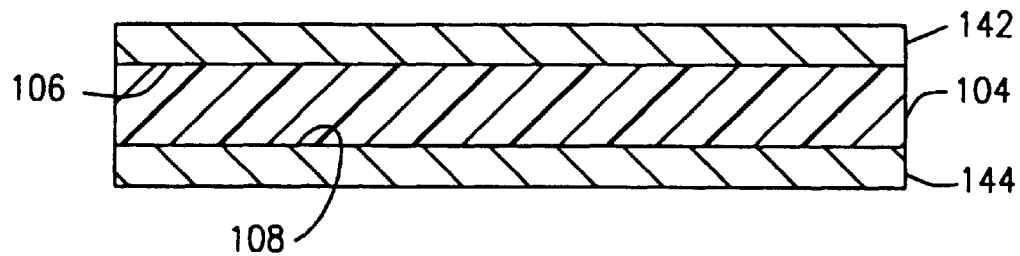
FIGS. 3–7 are cross-sectional views showing various stages in the fabrication of a connector in a circuit panel in accordance with one embodiment of the present invention.
Figure 4:
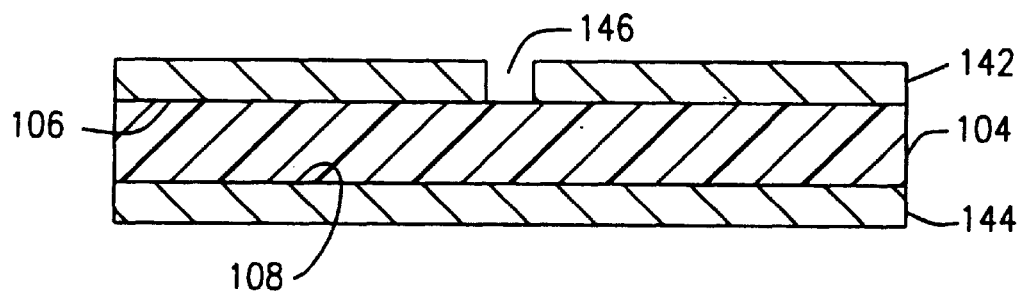
Figure 5:
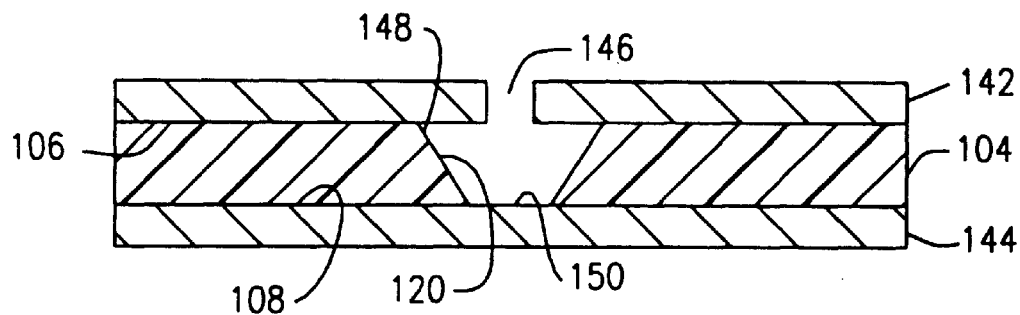
Figure 6:
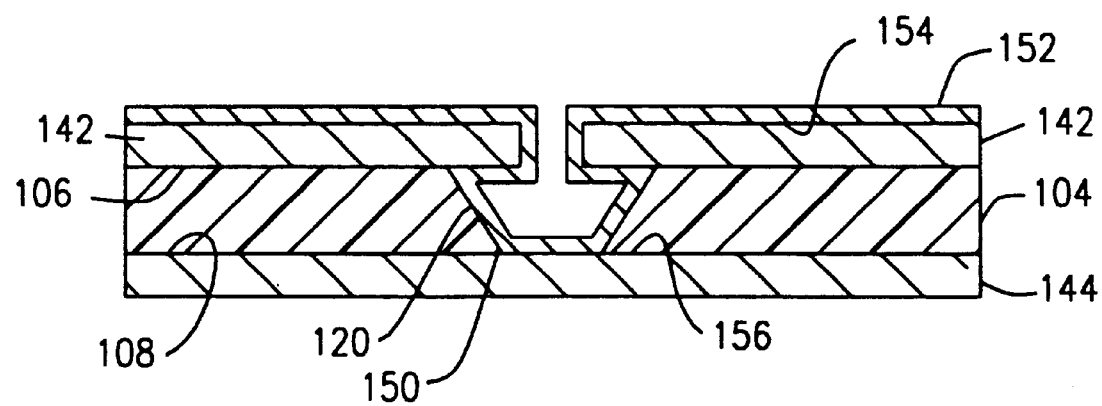
Figure 7:
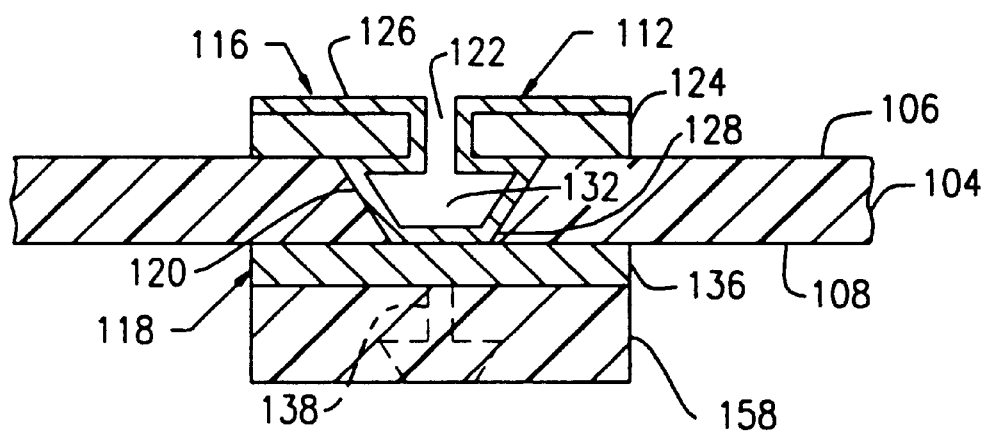

Referring now to the drawings, wherein like reference numerals represent like elements, there is shown in FIG. 1 a multilayer structure generally designated by reference numeral 100. The structure 100, as illustrated, is composed of a plurality of stacked separate circuit panels 102, three such circuit panels being shown by way of example only, which are interconnected in accordance with the present invention. Each circuit panel 102, as best shown in FIG. 2, incorporates a body 104 of dielectric material having oppositely directed major upper and lower surfaces 106, 108. The area of the major surfaces 106, 108 are substantially greater than the area of the edge surfaces 110 connecting the major surfaces. Generally, as shown, the body is substantially flat and sheet-like such that the major surfaces 106, 108 are substantially parallel to one another.

Each circuit panel 102 is provided with a plurality of thru connectors generally designated by reference numeral 112. The connectors may be provided within the circuit panels 102 in a regular or irregular array, such as a rectilinear grid, for example, rows and columns. It is also contemplated that the connectors 112 may be arranged randomly within the circuit panels 102. As will be described hereinafter, each of the connectors 112 extend through the body 104 so as to have contact pads provided on the major surfaces 106, 108 as shown in FIG. 2. The connectors 112 on surfaces 106, 108 may be interconnected in a predetermined pattern by providing interconnecting circuit traces 114. The particular interconnection pattern will depend upon the purpose and layout of the electrical components (not shown) which will ultimately be mounted and/or connected to the multilayer structure 100. The electrical components may be provided in a variety of forms, for example, discrete components, semiconductive chips and the like. The circuit traces 114 thus form electrical conductive paths between the connectors 112 on the surfaces 106, 108 of the circuit panels 102.

Referring to FIG. 2, a portion of a circuit panel 102 is shown having one connector 112 by way of illustration only. The circuit panel 102 is formed from a body 104 of dielectric material, for example polyimide material. Electrical contacts 116, 118 are provided on opposing surfaces 106, 108 spaced apart by the body 104. The contacts 116, 118 are aligned with an opening or hole 120 formed within the body 104 which extends between the major surfaces 106, 108. Contact 116 is provided with an opening or hole 122 which is aligned in communication with opening 120 and opposing a portion of contact 118 on surface 108. Opening 122 is preferably of other than circular shape. For example, the opening 122 may be in the shape of a three or four leaf clover as shown in FIG. 1. This shape provides inwardly directed prongs which provide for a better interference fit and welding of the post when inserted therein as to be described. In addition the use of a clover-like shape, or other than circular shape, allows for misregistration tolerances of the post pitch.

Contact 116 is formed from a contact pad 124 through which opening 122 extends. The contact pad 124 is formed directly on the surface 106 of the body 104 surrounding opening 122. Contact 116 further includes an outer layer 126 which further defines a conductive layer 128 lining opening 122 in contact pad 124 and opening 120 in the body 104 of the circuit panel 102. Conductive layer 128 has a base portion 130 in engagement with the exposed portion of contact 118 within opening 120 so as to form a blind end to the opening adjacent surface 108. The conductive layer 128 conforms to the shape of opening 120, thereby providing a generally corresponding shaped interior opening 132 which is in communication with opening 122. In accordance with the embodiment shown, opening 122 has an effective diameter generally smaller than the effective diameter of the interior opening 132. By effective diameter it is generally meant, in particular as to non-spherical shapes, that the overall size of the opening 122 will be smaller than the overall size of the interior opening 132. As a result of this arrangement, the conductive layer 128 forms a lip 134 surrounding opening 122 where it communicates with the interior opening 132.

Contact 118 is formed from a solid contact pad 136 directly on surface 108 having a portion engaged by the base portion 130 of conductive layer 128 which forms the blind end of opening 120. A post-like element 138 is provided extending outwardly from the surface of contact pad 136. The post 138 is formed in the nature of a solid post-like bump having a distal end portion 140. The post 138 may have any cross-sectional shape, for example, circular, oval, rectangular and the like. Similarly, the distal end portion 140 may have any desired cross sectional shape. As shown, the distal end portion 140 has a trapezoidal shape which generally corresponds to the shape of the interior opening 132 formed by the conductive layer 128 in the embodiment thus described. The effective diameter of the distal end portion 140 is slightly greater than the diameter of opening 122 which extends through contact 116 and into the interior opening 132. As a result of this construction, there is provided a snap fit of the distal end portion 140 as it is captured within the interior opening 132 by lip 134 which is surrounded by the conductive layer 128 as to be described hereinafter. The effective size of interior opening 132 may also be slightly smaller than the effective size of the distal end portion 140 to attain a friction fit therebetween.

One method of making a circuit panel 102 having at least one, and preferably a plurality of connectors 112 arranged in an array will now be described with reference to FIGS. 3–7. A dielectric body 104, in the nature of a sheet-like element, is first covered on both major surfaces 106, 108 with metallic layers 142, 144 such as a copper, copper-nickel, berylium-copper layer and the like. The metallic layers 142, 144 may be laminated onto the surfaces 106, 108 of the body 104 or may be plated using conventional electroplating processes. At the desired location of the connectors 112, an opening 146 is etched through metallic layer 142 using a photoresist mask which is applied over the surface of the metallic layer 142 where the openings 146 are to be formed. The mask may be applied as a discrete, preformed element, or else may be formed by photographic techniques. The mask may be formed from any suitable material, including a polymer material such as photoresist, a sheet of molybdenum, or may include a layer of molybdenum on a polymeric substrate. The exposed metallic layer 142 is etched using a suitable etching such as an acid or other etching solution. The etched opening 146 extends through the metallic layer 142 to the surface 106 of the dielectric body 104.

Using the metallic layer 142 as a mask, an opening 120 in the nature of a via is formed in the dielectric body 104 by ablation, for example, using radiant energy directed through opening 146, or chemical plasma etching processing. Opening 120 will therefore have the same shape as opening 146, for example, non-circular. The radiant energy applied to provide this ablation typically includes a $CO_2$, excimer, yag or Krf laser operating under conditions which will substantially ablate the dielectric body 104, but which will not substantially affect the material of the metallic layer 142.

The nature of the chemical or plasma etching process typically forms opening 120 having a larger diameter at its upper end 148 adjacent metallic layer 142 and a smaller diameter at its blind end 150 adjacent metallic layer 144. This resulting configuration of the opening 120 is believed to be due to the longer exposure time to the etch solution at the upper end 148 of the opening 120 than at the blind end 150. By providing opening 146 in the metallic layer 142 smaller than the resulting opening 120 in the dielectric body 104, this provides for a snap fit as previously described.

A conductive layer 152 such as gold, copper or other conductive metals and alloys is deposited over the surface of metallic layer 142 and into the opening 120. In this regard, the entire top surface 154 of the metallic layer 142 is plated together with the entire internal surfaces of the opening 120 formed within the dielectric body 104, which may also include a tin flashing to enhance bonding with the post 138. The blind end 150 is formed by surface 156 of the metallic layer 144 in the region overlying opening 120. At this stage of the fabrication process, the conductive layer 152 electrically interconnects the upper and lower metallic layers 142, 144.

Contacts 116 are completed on the major surface 106 using a suitable photoresist mask or the like so as to define the geometry and location of the contact pads 124. At the same time, the interconnecting circuit traces 114 may also be formed from the metallic layer 142 and conductive layer 152 so as to interconnect the various connectors 112 throughout the circuit panel 102 in the desired pattern. The exposed portions of the metallic layer 142 and conductive layer 152 may be removed using ablation, such as by laser, or chemical or plasma etching processes. The previous step will define the geometry and location of each of the connectors 112 and interconnecting circuit traces 114 simultaneously on the surface 106 of the body 104. In a similar manner, a suitable photoresist mask 158 and the like may be used to delineate the contacts 118 and interconnecting circuit traces 114 from metallic layer 144 which has been provided on the opposing surface 108 of the body 104. The contact pads 136 of each contact 118 will be aligned overlying the opening 120 so as to provide electrical interconnection with conductive layer 128 which interconnects with contacts 116 on the upper surface 106 of body 104. The circuit traces 114 on the upper and lower surfaces 106, 108 are therefore interconnected in a predetermined pattern via the connectors 112 which are formed through the body 104 by virtue of the conductive layer 128 electrically connecting contacts 116, 118.

Post 138 is formed on the resulting contact pad 136 which was formed from the metallic layer 144. Post 138 can be deposited separately onto the exposed surface of the contact pad 136 by additive electroplating or chemical vapor deposition using a photographically patterned resist with open areas corresponding to the configuration of the post. Alternatively, the post 138 can be formed by first depositing a sacrificial metal layer onto the exposed surface of the contact pad 136 using conventional semiconductor processing, and subsequently etching the sacrificial metal layer to form the post 138 using a photographically patterned resist. The post 138 can also be formed by mechanically removing an upper portion of the sacrificial metal layer such as by grinding, ablation and the like. The post 138 may have a coating of gold to prevent oxidation and to enhance welding, such as cold welding, to the conductive layer 128 of an adjacent connector 112. In the alternative, the post may be coated with an anti-tarnish polymer layer which is removed by the bonding process. Alternatively, the post may have a tin flashing and the conductive layer formed of gold to enhance bonding of the post in the connector. It should therefore be apparent that the post can be configured to any desirable shape and size as may be desired. For example, as shown in FIG. 2, the completed connector 112 has a post 138 which includes a distal end portion 140 of trapezoidal shape.

The post 138 may have a diameter of about 1–2 mils., its length L" being in the range of about 1–4 mils., and preferably about 2 mils. The length of the post 138 will, in part, depend on whether it is desirable to have the post crushed during the insertion process. In this regard, the length of the post 138 will ultimately depend on the thickness of the circuit panel 102, the contact pad 124, outer layer 126, and optionally, adhesive layer 160. By way of example, the combined thickness of contact pad 124 and outer layer 126 is in the range of about 5–25 microns. From the foregoing, it should be understood that the aspect ratio of the post 138 can be other than 1:1, i.e., the length being greater than the diameter, particularly when it is desired that the post crush during insertion into the connector 112.

Figure 8:
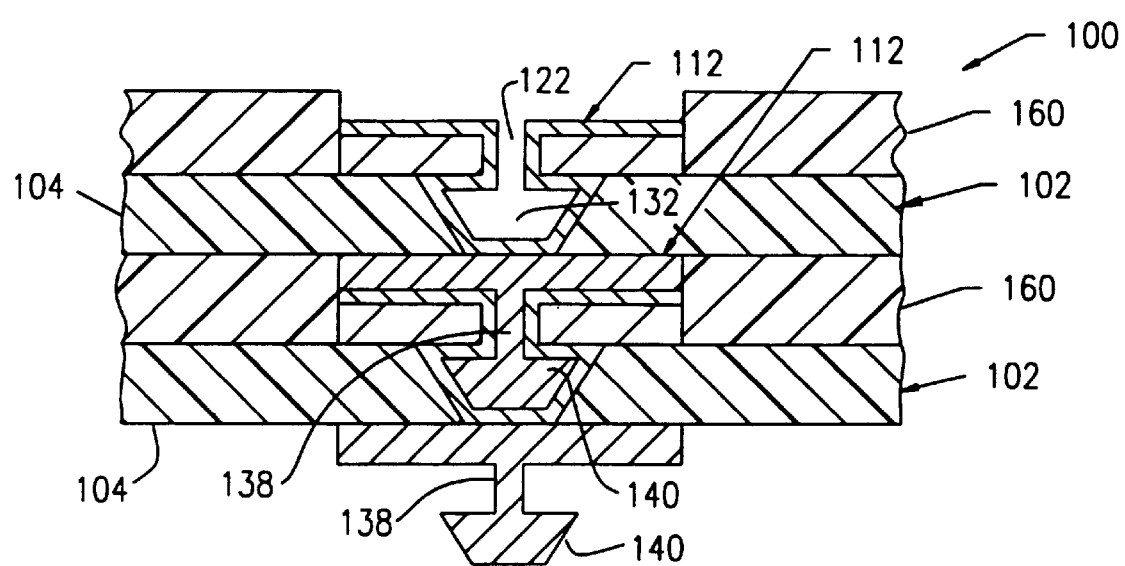
FIG. 8 is a cross-sectional view showing a multilayer stack of circuit panels interconnected using connectors as shown in FIG. 2.

Referring now to FIG. 8, a plurality of circuit panels 102 may be interconnected to one another to form a multilayer structure 100 having interconnected traces 114. The individual circuit panels 102 are interconnected by aligning the connectors 112 on one circuit panel 102 with a corresponding connector on an adjacent circuit panel. A sufficient force is applied between the two circuit panels 102 so as to insert the distal end portion 140 of post 138 into the connector 112 through opening 122 whereby the distal end portion is captured within the interior opening 132 defined by the conductive layer 128. In accordance with one embodiment as shown in FIG. 2, the post 138 has an enlarged distal end portion which is captured within the interior opening 132 in the manner of a snap fit by virtue of opening 122 within contact pad 124 being effectively smaller in size. In this manner, a plurality of circuit panels 102 may be interconnected using stacked connectors 112 in accordance with the present invention. As shown, the configuration and dimensioning of the connectors 112 will generally result in the contact pad 136 of one circuit panel 102 abutting against the contact pad 124 of an adjacent circuit panel.

The connectors 112 of the present invention provide a low inductance connection between a plurality of circuit panels 102 in a multilayer structure 100. The construction of the connectors 112, for example, by providing a snap or interference fit with the post 138, creates relatively low levels of inductance when conducting current therethrough. The connector 112 may be provided with an electrically conductive material before assembly of the circuit panels 102 into a multilayer structure 100 by insertion of a post 138 into the connector. The conductive material is generally provided within the interior opening 132 formed in the connector 112 by the conductive layer 128. The conductive material mechanically and electrically bonds the post 138 to the interior of the conductor 112. The conductive material may be a solder paste such as a polymer/metal bonding material which includes a dispersion of a metal such as silver or gold particles in a thermoplastic polymer such as Ultem material or thermosetting polymer such as an epoxy.

A layer 160 of dielectric adhesive or similar compliant material in the range of about 25–50 microns thick may be provided on one or both surfaces 106, 108 of adjoining circuit panels 102 to seal the regions surrounding contacts 116, 118, and to support and mechanically connect the circuit panels in regions between the contacts. The adhesive or compliant material may be provided as a sheet having holes corresponding to the size and locations of the contacts. The sheet is initially aligned with the contacts 116, 118 on one of the surfaces 106, 108, and assembled onto the circuit panel 102 before adjoining the adjacent circuit panel to form the multilayer structure 100. It is not required that the adhesive layer 160 have preformed openings. In this regard, the posts 138 will penetrate the adhesive layer 160 overlying the openings 122 during their insertion into the connectors 112.

Alternatively, the adhesive may be a flowable adhesive printed or stenciled onto one or both of the surfaces 106, 108 of the circuit panels 102 before assembly. It is contemplated that the openings 122, particularly when enlarged such as in clover shape, will allow excess adhesive to flow into the interior opening 132 during the assembly process. This will eliminate excess adhesive around the connectors 112 to provide a flatter or more planar multilayer structure 100. In addition, any adhesive within the interior opening 132 will enhance the mechanical bonding of the post within the connector 112, which is facilitated by its cold welding therein. The adhesive or compliant layer 160 may be formed from dielectric materials such as polyimide, polyetherimide and the like.

Figure 9:
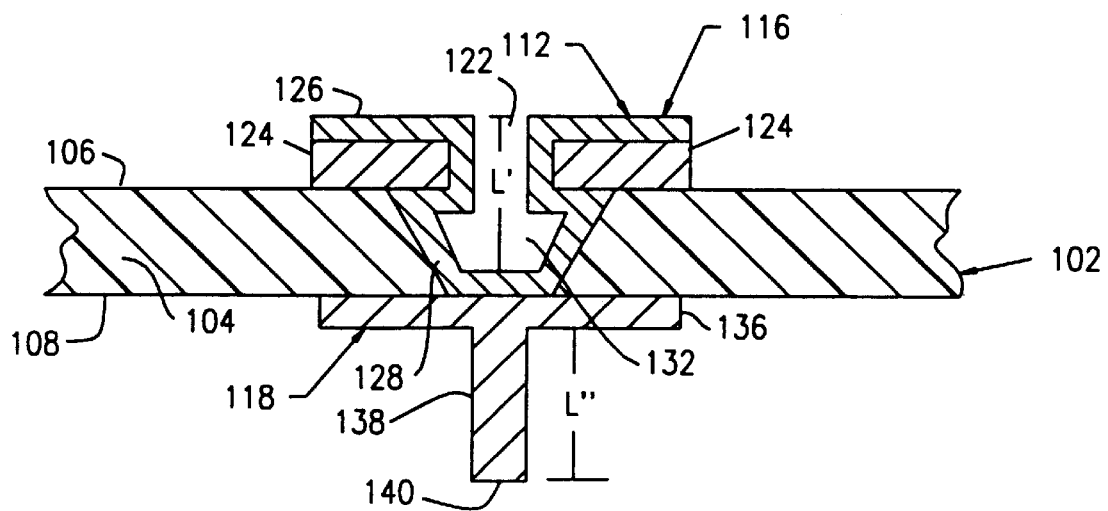
FIG. 9 is a cross-sectional view of a connector in accordance with another embodiment of the present invention for interconnecting a plurality of circuit panels in a multilayer stack.

In accordance with another embodiment of the present invention as shown in FIG. 9, the post 138 is formed as a uniform elongated cylindrical member. The openings 122, 132 are defined by the conductive layer 128. The opening 120 in the dielectric body 104 which during fabrication defines the shape of interior opening 132 may therefore have a cross-sectional area as noted hereinabove which can be formed using laser drilling, or other such ablation techniques. In this configuration, the post 138 may have a diameter slightly larger than that formed in an adjacent connector 112 to provide an interference fit whereby a wiping action occurs during insertion which will facilitate removal of any oxide layer, as well as providing intimate surface-to-surface contact for positive electrical continuity therebetween. The wiping action may further induce friction welding or "cold" welding between those two components, forming a permanent mechanical bond. As previously noted, the openings 122, 132 may be of other than circular shape, such as three and four leaf clover shape, oval or the like. Here again, this allows for misregistration of the posts 138.

Post 138 may be longer in length L" than the vertical clearance provided in the connector 112 designated as length L'. In this case, the post 138 is partially crushed during assembly when inserted into the connector 112 as its distal end portion 140 bottoms out against the conductive layer 128 opposing contact pad 136. The crushing provides additional wiping action between the aforementioned elements, and the crushed post 138 will therefore function as a retainer element within the interior opening 132 of the connector 112, preventing the post from sliding out from the connector.

Figure 10:
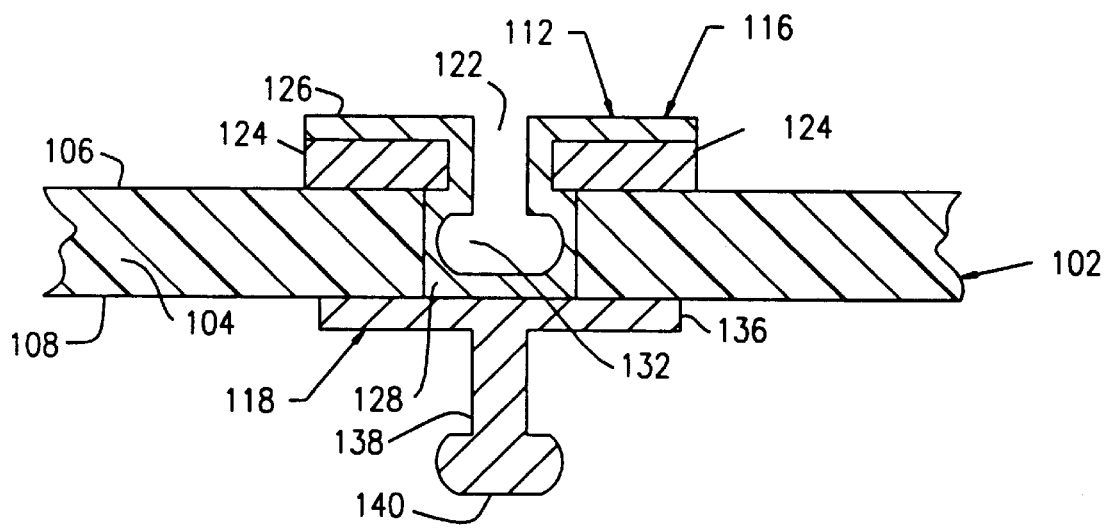
FIG. 10 is a cross-sectional view of a connector in accordance with another embodiment of the present invention for interconnecting a plurality of circuit panels in a multilayer stack.

In the embodiment disclosed in FIG. 10, the distal end portion 140 is formed having a spherical bulbous shape as opposed to the cylindrical shape shown in FIG. 9 or the trapezoidal shape as shown in FIG. 2. The bulbous shape will provided for a snap fit as previously described with respect to the circuit panel 102 shown in FIG. 2. As also shown, the interior opening 132 within the connector 112 also has a generally spherical bulbous shape. It should therefore be appreciated that the shape of the post 138, and particularly the distal end portion 140 may have a variety of forms and configurations, as well as the interior opening 132.

As these and other variations and combinations of the features set forth above can be utilized without departing from the invention, the foregoing description of the preferred embodiments should be taken by way of illustration rather than by way of limitation of the invention as defined by the claims.

What is claimed is:

1. A connector for making electrical connection to an element, said connector comprising a body defining first and second surfaces opposing each other and an opening extending through said body between said first and second surfaces, a first contact on said first surface proximate said opening, a second contact on said second surface overlying said opening, a conductive layer lining the interior of said opening within said body and in contact with said first and second contacts, and an electrically conductive post in contact with said second contact and extending away from said opening, said conductive layer defining a post receiving opening within said body.

2. The connector of claim 1, wherein said conductive layer forms a blind end of said opening adjacent said second surface.

3. The connector of claim 2, wherein said second contact overlies said blind end formed by said conductive layer.

4. The connector of claim 1, wherein said conductive layer defines an opening within said body having a blind end adjacent said second surface in contact with said second contact and said post receiving open end within said first contact.

5. The connector of claim 4, wherein said post is arranged in alignment with said post receiving opening defined by said conductive layer.

6. The connector of claim 4, wherein said post has a terminal portion of predetermined shape, said post receiving opening defined by said conductive layer having a corresponding shape.

7. The connector of claim 4, wherein the effective diameter of said post receiving opening defined by said conductive layer is greater than the effective diameter of said open end.

8. The connector of claim 1, further including an adhesive layer on one of said first and second surfaces for adhering said body an element.

9. The connector of claim 1, wherein said post extends substantially perpendicular to said second surface of said body in alignment with said post receiving opening.

10. The connector of claim 1, wherein said conductive layer extends over a portion of the surface of said first contact.

11. The connector of claim 10, wherein the length of said post is substantially the same as the length of said post receiving opening from the surface of said conductive layer overlying said first contact at one end of said post receiving opening to the surface of said conductive layer within said post receiving opening at the other end of said post receiving opening adjacent said second surface.

12. The connector of claim 10, wherein the length of said post is greater than the length of said post receiving opening from the surface of said conductive layer overlying said first contact at one end of said post receiving opening to the surface of said conductive layer within said post receiving opening at the other end of said post receiving opening adjacent said second surface.

13. The connector of claim 1, wherein said post has a terminal end having an effective diameter larger than the effective diameter of the remaining portion of said post.

14. The connector of claim 1, wherein said conductive layer defines said post receiving opening within said body having a blind end adjacent said second surface in contact with said second contact, further including a conductive material within said post receiving opening.

15. The connector of claim 1, wherein the post receiving opening is dimensioned for receiving a post therein from an adjacent connector.

16. A circuit panel for making electrical connection to contacts on an adjacent circuit panel, said circuit panel comprising a body defining first and second surfaces opposing each other, an opening extending through said body between said first and second surfaces, a first contact on said first surface surrounding said opening thereat, a second contact on said second surface overlying said opening thereat, a conductive layer lining the interior of said opening within said body in contact with said first and second contacts, said conductive layer defining an opening within said body having a blind end adjacent said second surface in contact with said second contact and an open end extending through said first contact, said conductive layer extending over a portion of the surface of said first contact, and an electrically conductive post in contact with said second contact and extending away from said opening, said conductive layer defining a post receiving opening within said body.

17. The circuit panel of claim 16, wherein the post receiving opening is dimensioned for receiving a post therein from an adjacent connector.

18. The circuit panel of claim 16, wherein said second contact is in alignment with said opening formed by said conductive layer.

19. The circuit panel of claim 16, wherein said post has a terminal portion of predetermined shape, said post receiving opening defined by said conductive layer having a corresponding shape.

20. The circuit panel of claim 16, wherein the effective diameter of said post receiving opening defined by said conductive layer is greater than the effective diameter of said open end thereof.

21. The circuit panel of claim 16, further including an adhesive layer on one of said first and second surfaces for adhering said circuit panel to said adjacent circuit panel.

22. The circuit panel of claim 16, wherein the length of said post is substantially the same as the length of said post receiving opening from the surface of said conductive layer overlying said first contact at one end of said post receiving opening to the surface of said conductive layer within said post receiving opening at the other end of said post receiving opening adjacent said second surface.

23. The circuit panel of claim 16, wherein the length of said post is greater than the length of said post receiving opening from the surface of said conductive layer overlying said first contact at one end of said post receiving opening to the surface of said conductive layer within said post receiving opening at the other end of said post receiving opening adjacent said second surface.

24. The circuit panel of claim 16, wherein said post has a terminal end having an effective diameter larger than the effective diameter of the remaining portion of said post.

25. The circuit panel of claim 16, wherein said post is substantially perpendicular to said second surface.

26. A multilayer interconnected circuit structure comprising a first and second circuit panel each having at least one connector constructed in accordance with claim 1, said post of said first circuit panel received within said post receiving opening of said second circuit panel.

27. The structure of claim 26, wherein said conductive layer of said first circuit panel extends over a portion of said first contact of said first circuit panel, said second contact of said second circuit panel being in contact with said conductive layer extending over said first contact of said first circuit panel.

28. The structure of claim 27, wherein the length of said post is substantially the same as the length of said post receiving opening from the surface of said conductive layer overlying said first contact at one end of said post receiving opening to the surface of said conductive layer within said post receiving opening at the other end of said post receiving opening adjacent said second surface.

29. The structure of claim 27, wherein the length of said post is greater than the length of said post receiving opening from the surface of said conductive layer overlying said first contact at one end of said post receiving opening to the surface of said conductive layer within said post receiving opening at the other end of said post receiving opening adjacent said second surface.

30. The structure of claim 26, further including an adhesive layer between the first surface of said first circuit panel and said second surface of said second circuit panel for adhering said first and second circuit panels together.

31. The structure of claim 26, further including at least one circuit trace supported on one of said first and second surfaces of one of said circuit panels.

32. The structure of claim 26, further including a plurality of circuit traces provided on the first and second surfaces of said first and second circuit panels, said traces in contact with at least one of said connectors.

33. The structure of claim 26, wherein said conductive layer of each circuit panel defines said post receiving opening within a corresponding one of said bodies having a blind end adjacent said second surface in contact with said second contact and an open end within said first contact.

34. The structure of claim 33, wherein the effective diameter of said post receiving opening defined by said conductive layer is greater than the effective diameter of said open end thereof.

35. The structure of claim 26, wherein said post has a configured distal end portion.

36. A multilayer interconnected circuit structure comprising a first and second circuit panel having at least one connector constructed in accordance with claim 16, said post of said first circuit panel received within said post receiving opening of said second circuit panel.

37. The structure of claim 36, wherein the length of said post is substantially the same as the length of said post receiving opening from the surface of said conductive layer overlying said first contact at one end of said post receiving opening to the surface of said conductive layer within said post receiving opening at the other end of said post receiving opening adjacent said second surface.

38. The structure of claim 36, wherein the length of said post is greater than the length of said post receiving opening from the surface of said conductive layer overlying said first contact at one end of said post receiving opening to the surface of said conductive layer within said post receiving opening at the other end of said post receiving opening adjacent said second surface.

39. The structure of claim 36, further including an adhesive layer between the first surface of said first circuit panel and said second surface of said second circuit panel for adhering said first and second current panels together.

40. The structure of claim 36, wherein said conductive layer of each circuit panel defines an opening within a corresponding body having a blind end adjacent said second surface in contact with said second contact and an open end within said first contact.

41. The structure of claim 36, further including at least one circuit trace supported on one of said first and second surfaces of one of said circuit panels.

42. The structure of claim 36, further including a plurality of circuit traces provided on the first and second surfaces of said first and second circuit panels, said traces in contact with at least one of said connectors.

43. A method of making a connector for an element having a body defining first and second surfaces opposing each other, said method comprising the steps of forming a first contact on said first surface and a second contact on said second surface in alignment with said first contact, forming an opening through said first contact and said body terminating at said second contact, depositing a conductive layer lining the interior of said opening within said body and in contact with said first and second contacts and forming a post extending away from said second surface in contact with said second contact.

44. The method of claim 43, further including the step of depositing said conductive layer into said opening to form a blind end adjacent said second surface.

45. The method of claim 44, further including the step of forming said second contact overlying said blind end formed by said conductive layer.

46. The method of claim 43, further including the step of depositing said conductive layer to define an opening within said body having a blind end adjacent said second surface in contact with said second contact and an open end extending through said first contact.

47. The method of claim 46, further including the step of arranging said post in alignment with said opening defined by said conductive layer.

48. The method of claim 46, further including the step of forming a terminal portion of said post having a predetermined shape, said opening defined by said conductive layer having a corresponding shape.

49. The method of claim 46, further including the step of providing the effective diameter of said opening defined by said conductive layer greater than the effective diameter of said open end thereof.

50. The method of claim 43, further including the step of providing an adhesive layer on one of said first and second surfaces for adhering said circuit element to said adjacent element.

51. The method of claim 43, further including the step of arranging said second contact overlying said opening and said post extending substantially perpendicular to said second surface of said body in alignment with said opening.

52. The method of claim 43, further including the step of extending said conductive layer over a portion of the surface of said first contact.

53. The method of claim 52, further including the step of providing the length of said post substantially the same as the length of said opening from the surface of said conductive layer overlying said first contact at one end of said opening to the surface of said conductive layer within said opening at the other end of said opening adjacent said second surface.

54. The method of claim 52, further including the step of providing the length of said post greater than the length of said opening from the surface of said conductive layer overlying said first contact at one end of said opening to the surface of said conductive layer within said opening at the other end of said opening adjacent said second surface.

55. The method of claim 43, further including the step of forming said post including a terminal end having an effective diameter larger than the effective diameter of the remaining portion of said post.

56. The method of claim 43, further including the step of providing said conductive paste within an opening defined by said conductive layer.

57. A method of making a circuit panel for making electrical connection to contacts on an adjacent circuit panel, said circuit panel including a body defining first and second surfaces opposing each other, said method comprising the steps of forming an opening extending through said body between said first and second surfaces, forming a first contact on said first surface surrounding said opening thereat and a second contact on said second surface overlying said opening thereat, depositing a conductive layer lining the interior of said opening within said body in contact with said first and second contacts and over a portion of the surface of said first contact, said conductive layer defining an opening within said body having a blind end adjacent said second surface in contact with said second contact and an open end extending through said first contact, and forming a post extending from said second contact in alignment with said opening formed by said conductive layer.

58. The method of claim 57, further including the step of depositing said conductive layer into said opening to form a blind end adjacent said second surface.

59. The method of claim 58, further including the step of forming said second contact overlying said blind end formed by said conductive layer.

60. The method of claim 57, further including the step of depositing said conductive layer to define an opening within said body having a blind end adjacent said second surface in contact with said second contact and an open end extending through said first contact.

61. The method of claim 60, further including the step of arranging said post in alignment with said opening defined by said conductive layer.

62. The method of claim 60, further including the step of forming a terminal portion of said post having a predetermined shape, said opening defined by said conductive layer having a corresponding shape.

63. The method of claim 60, further including the step of providing wherein the effective diameter of said opening defined by said conductive layer greater than the effective diameter of said open end thereof.

64. The method of claim 57, further including the step of providing an adhesive layer on one of said first and second surfaces for adhering said circuit panel to said adjacent circuit panel.

65. The method of claim 57, further including the step of arranging said second contact overlying said opening and said post extending substantially perpendicular to said second surface of said body in alignment with said opening.

66. The method of claim 57, wherein said body comprises dielectric material.

67. The method of claim 57, further including the step of providing the length of said post substantially the same as the length of said opening from the surface of said conductive layer overlying said first contact at one end of said opening to the surface of said conductive layer within said opening at the other end of said opening adjacent said second surface.

68. The method of claim 57, further including the step of providing the length of said post greater than the length of said opening from the surface of said conductive layer overlying said first contact at one end of said opening to the surface of said conductive layer within said opening at the other end of said opening adjacent said second surface.

69. The method of claim 57, further including the step of forming said post including a terminal end having an effective diameter larger than the effective diameter of the remaining portion of said post.

70. The method of claim 57, further including the step of providing said conductive paste within an opening defined by said conductive layer.

71. The method of claim 57, further including the step of forming at least one circuit trace supported on one of said first and second surfaces of one of said circuit panels.

72. The method of claim 57, further including the step of forming a plurality of circuit traces provided on the first and second surfaces of said first and second circuit panels, said current traces in contact with at least one of said connectors.

73. A connector constructed in accordance with the method of claim 43.

74. A circuit panel constructed in accordance with the method of claim 57.

75. A connector for making electrical connection to an element, said connector comprising a body defining first and second surfaces opposing each other and an opening extending through said body between said first and second surfaces, a first contact on said first surface proximate said opening, a second contact on said second surface overlying said opening, a conductive layer lining the interior of said opening within said body and in contact with said first and second contacts, said conductive layer extending over a portion of the surface of said first contact, and a post extending away from said second surface in contact with said second contact, the length of said post being greater than the length of said opening from the surface of said conductive layer overlying said first contact at one end of said opening to the surface of said conductive layer within said opening at the other end of said opening adjacent said second surface.

76. A circuit panel for making electrical connection to contacts on an adjacent circuit panel, said circuit panel comprising a body defining first and second surfaces opposing each other, an opening extending through said body between said first and second surfaces, a first contact on said first surface surrounding said opening thereat, a second contact on said second surface overlying said opening thereat, a conductive layer lining the interior of said opening within said body in contact with said first and second contacts, said conductive layer defining an opening within said body having a blind end adjacent said second surface in contact with said second contact and an open end extending through said first contact, said conductive layer extending over a portion of the surface of said first contact, an adhesive layer on one of said first and second surfaces for adhering said circuit panel to said adjacent circuit panel, and a post extending from said second contact in alignment with said opening within said body formed by said conductive layer.

77. A circuit panel for making electrical connection to contacts on an adjacent circuit panel, said circuit panel comprising a body defining first and second surfaces opposing each other, an opening extending through said body between said first and second surfaces, a first contact on said first surface surrounding said opening thereat, a second contact on said second surface overlying said opening thereat, a conductive layer lining the interior of said opening within said body in contact with said first and second contacts, said conductive layer defining an opening within said body having a blind end adjacent said second surface in contact with said second contact and an open end extending through said first contact, said conductive layer extending over a portion of the surface of said first contact, and a post extending from said second contact in alignment with said opening formed by said conductive layer, the length of said post being greater than the length of said opening from the surface of said conductive layer overlying said first contact at one end of said opening to the surface of said conductive layer within said opening at the other end of said opening adjacent said second surface.

78. A multilayer interconnected circuit structure comprising a first and second circuit panel each having at least one connector comprising a body defining first and second surfaces opposing each other and an opening extending through said body between said first and second surfaces, a first contact on said first surface proximate said opening, a second contact on said second surface overlying said opening, a conductive layer lining the interior of said opening within said body and in contact with said first and second contacts, and a post extending away from said second surface in contact with said second contact, said post of said first circuit panel received within said opening defined by said conductive layer of said second circuit panel, said conductive layer of said first circuit panel extending over a portion of said first contact of said first circuit panel, said second contact of said second circuit panel being in contact with said conductive layer extending over said first contact of said first circuit panel.

79. A multilayer interconnected circuit structure comprising a first and second circuit panel each having at least one connector a body defining first and second surfaces opposing each other and an opening extending through said body between said first and second surfaces, a first contact on said first surface proximate said opening, a second contact on said second surface overlying said opening, a conductive layer lining the interior of said opening within said body and in contact with said first and second contacts, and a post extending away from said second surface in contact with said second contact, said post of said first circuit panel received within said opening defined by said conductive layer of said second circuit panel, and an adhesive layer between the first surface of said first circuit panel and said second surface of said second circuit panel for adhering said first and second circuit panels together.

80. A multilayer interconnected circuit structure comprising a first and second circuit panel having at least one connector comprising a body defining first and second surfaces opposing each other, an opening extending through said body between said first and second surfaces, a first contact on said first surface surrounding said opening thereat, a second contact on said second surface overlying said opening thereat, a conductive layer lining the interior of said opening within said body in contact with said first and second contacts, said conductive layer defining an opening within said body having a blind end adjacent said second surface in contact with said second contact and an open end extending through said first contact, said conductive layer extending over a portion of the surface of said first contact, and a post extending from said second contact in alignment with said opening within said body formed by said conductive layer, said post of said first circuit panel received within said opening defined by said conductive layer of said second circuit panel, the e length of said post being greater than the length of said opening from the surface of said conductive layer overlying said first contact at one end of said opening to the surface of said conductive layer within said opening at the other end of said opening adjacent said second surface.

81. A multilayer interconnected circuit structure comprising a first and second circuit panel having at least one connector comprising a body defining first and second surfaces opposing each other, an opening extending through said body between said first and second surfaces, a first contact on said first surface surrounding said opening thereat, a second contact on said second surface overlying said opening thereat, a conductive layer lining the interior of said opening within said body in contact with said first and second contacts, said conductive layer defining an opening within said body having a blind end adjacent said second surface in contact with said second contact and an open end extending through said first contact, said conductive layer extending over a portion of the surface of said first contact, and a post extending from said second contact in alignment with said opening within said body formed by said conductive layer, said post of said first circuit panel received within said opening defined by said conductive layer of said second circuit panel, and an adhesive layer between the first surface of said first circuit panel and said second surface of said second circuit panel for adhering said first and second current panels together.

* * * * *

UNITED STATES PATENT AND TRADEMARK OFFICE
CERTIFICATE OF CORRECTION

PATENT NO. : 6,188,028 B1
DATED : February 13, 2001
INVENTOR(S) : Haba et al.

It is certified that error appears in the above-identified patent and that said Letters Patent is hereby corrected as shown below:

Title page,
Abstract Section
Line 2, "posts" should read -- means of connectors --.
Line 8, cancel "of a connecting post".

Column 1
Line 38, after "discrete" cancel ",".
Line 62, after "prepregs" insert -- , --.

Column 2,
Line 18, after "example" insert -- , --.
Line 35, "is" should read -- are --.

Column 4,
Line 49, "are" should read -- is --.

Column 7,
Line 45, "are" should read -- is -- .

Column 8,
Line 18, after "addition, insert -- , --.

Column 9,
Line 67, "158" should read -- 159 --.

Column 12,
Line 53, "an" should read -- said post receiving --.

UNITED STATES PATENT AND TRADEMARK OFFICE
CERTIFICATE OF CORRECTION

PATENT NO. : 6,188,028 B1
DATED : February 13, 2001
INVENTOR(S) : Haba et al.

It is certified that error appears in the above-identified patent and that said Letters Patent is hereby corrected as shown below:

Column 12,
Line 55, "said post receiving" should read -- an --.

Column 13,
Line 3, after "body" insert -- to --.

Column 18,
Line 47, after "connector" insert -- comprising --.

Signed and Sealed this

Twenty-fifth Day of September, 2001

Attest:

*Nicholas P. Godici*

NICHOLAS P. GODICI
*Attesting Officer*       *Acting Director of the United States Patent and Trademark Office*